(12) United States Patent
Grout

(10) Patent No.: US 11,223,365 B1
(45) Date of Patent: Jan. 11, 2022

(54) APERTURE NOISE SUPPRESSION USING SELF-REFERRED TIME MEASUREMENTS

(71) Applicant: BAE Systems Information and Electronic Systems Integration Inc., Nashua, NH (US)

(72) Inventor: Kevin Grout, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/123,384

(22) Filed: Dec. 16, 2020

(51) Int. Cl.
| | | |
|---|---|---|
| *H03M 1/60* | (2006.01) | |
| *H03M 1/08* | (2006.01) | |
| *H03M 1/12* | (2006.01) | |
| *H03M 1/06* | (2006.01) | |
| *G04F 10/00* | (2006.01) | |
| *H03M 1/00* | (2006.01) | |

(52) U.S. Cl.
CPC ........ *H03M 1/0836* (2013.01); *G04F 10/005* (2013.01); *H03M 1/0663* (2013.01); *H03M 1/12* (2013.01); *H03M 1/00* (2013.01)

(58) Field of Classification Search
CPC .... H03M 1/0836; H03M 1/0663; H03M 1/12; H03M 1/00; G04F 10/005
USPC .......................................... 341/157, 118, 155
See application file for complete search history.

(56) References Cited

U.S. PATENT DOCUMENTS

| | | | |
|---|---|---|---|
| 8,203,472 B2 * | 6/2012 | Robinson ............ | H03M 1/0836 341/118 |
| 8,957,796 B2 | 2/2015 | Waltari et al. | |
| 10,802,447 B1 | 10/2020 | Grout | |

OTHER PUBLICATIONS

Adam Strak & Hannu Tenhunen, Suppression of Jitter Effects in A/D Converters through Sigma-Deita Sampling, IEEE Computer Society Annual Symposium on VLSI, 2004, pp. 121-126.

(Continued)

*Primary Examiner* — Joseph J Lauture
(74) *Attorney, Agent, or Firm* — Sand, Sebolt & Wernow LPA; Gary McFaline

(57) ABSTRACT

A system and method for suppressing aperture noise resulting from clock jitter associated with a Nyquist analog-to-digital converter (ADC) using self-referred time measurements are provided. The system comprises of a clock, a delay element, a time subtractor, a time-to-digital converter, a filter element, a first digital subtractor, an integrator, a differentiator, and a multiplier. Each of the delay element, time subtractor, time-to-digital converter, filter element, first digital subtractor, integrator, and multiplier is electrically connected in parallel with the ADC, which allows the clock to generate a clock signal that advances into the system and the ADC in order to isolate and suppress the noise aperture associated with the ADC. As such, the architecture of the system is configured to isolate and suppress aperture noise resulting from clock jitter associated with an analog-to-digital converter (ADC) to allow the output signal of the system be independent of the aperture noise.

19 Claims, 2 Drawing Sheets

(56) References Cited

OTHER PUBLICATIONS

Bakti Darma Putra & Gerhard Fettweis, Clock Jitter Estimation and Suppression in OFDM Systems Employing Bandpass ΣΔ ADC, 2009 IEEE 10th Workshop on Signal Processing Advances in Wireless Communications, 2009, pp. 623-627.

Shiva Jamali-Zavareh & Ramesh Harjani, Jitter Suppression Techniques for High-Speed Sample-and-Hold Circuits, IEEE Transactions on Circuits and Systems-I, Jan. 2020, pp. 1-11, vol. 67 No. 1.

* cited by examiner

APERTURE NOISE SUPPRESSION USING SELF-REFERRED TIME MEASUREMENTS

STATEMENT OF GOVERNMENT INTEREST

This invention was made with government support under Contract No. FA8650-19-C-7935 awarded by the United States Air Force Research Lab. The government has certain rights in the invention.

TECHNICAL FIELD

The present disclosure relates to a system architecture for analog-to-digital converters. More particularly, the present disclosure relates to a system architecture for suppressing aperture noise resulting from clock jitter associated with a Nyquist analog-to-digital converter (ADC) using self-referred time measurements.

BACKGROUND

In conventional systems, clock jitter and/or aperture noise is difficult to isolate and suppress from a signal generated by a clock. As such, clock jitter is one of the main obstacles when trying to design an analog-to-converter that can operate at high frequency.

In current literature and prior art, skilled artisans in the art simply accept the jitter as the final limiting factor when digitizing an analog signal to a digital signal. Moreover, existing jitter isolating and/or cancelling techniques known in the field of this invention relate to delta-sigma based sampling techniques. The delta-sigma based sampling techniques described in this field are only useful for low input bandwidths as these techniques require oversampling. In comparison, a high resolution (e.g., greater than 12 bit) and high speed (e.g., greater than one gigasamples per second) analog-to-digital converter requires tens of resistor-capacitor (RC) system time constants to settle within a tolerable error range when processing analog signals into digital signals. The prior art in this field cannot arbitrarily reduce these RC constants due to kT/C noise source in the analog-to-digital converter. Furthermore, the use of oversampling in the delta-sigma based sampling prior art would require the oversampling ratio ("OSR") times more RC times constants per cycle where the OSR is defined by one half of the ratio of the sampling frequency to the signal's bandwidth. As such, the technique of oversampling described and used in the prior art cannot feasibly be accomplished for these types of analog-to-digital converters.

Based on the conventional technology and current problems in the field of this invention as to isolating and suppressing jitter and/or the resulting aperture noise associated to an ADC, an improvement is needed.

SUMMARY

In one aspect, an exemplary embodiment of the present disclosure may provide a system for measuring an estimated aperture noise by using self-referred time measurements. The system comprises of clock generator, a first mechanism, an ADC, an output signal of the ADC, and an output signal of the system. The clock generator is configured to generate a clock signal that includes the aperture noise. The first mechanism is electrically coupled to the clock generator and adapted to receive the clock signal. The ADC electrically coupled to the clock generator. The estimated aperture noise is subtracted from the output signal of the ADC such that the estimated aperture noise is independent of the output signal of the system.

In another aspect, an exemplary embodiment of the present disclosure may provide a system for measuring an estimated aperture noise by using self-referred time measurements. The system comprises of clock generator, a first mechanism, an ADC, an output signal of the ADC, and an output signal of the system. The clock generator is configured to generate a clock signal that includes the aperture noise. The first mechanism is electrically coupled to the clock generator and adapted to receive the clock signal. The ADC electrically coupled to the clock generator. The estimated aperture noise is subtracted from the output signal of the ADC such that the estimated aperture noise is independent of the output signal of the system. The system may further comprise of a delay element, a time subtractor, a time-to-digital converter (TDC), a filter element, a first digital subtractor, an integrator, a differentiator, and a multiplier. The delay element may be configured to delay the clock signal to obtain a delayed clock signal. The time subtractor may be configured to subtract the clock signal from the delayed clock signal to obtain a subtracted output signal. The TDC may be configured to quantize the subtracted output signal to obtain a quantized output signal. The filter element may be configured to average the quantized signal to obtain an averaged quantized signal. The first digital subtractor may be configured to subtract the averaged quantized signal from the quantized signal to obtain an error signal. The integrator may be configured to integrate the error signal to obtain an integrated error signal. The differentiator may be configured to differentiate the output signal of the ADC to obtain a differentiated output signal of the ADC. The multiplier may be configured to multiply the integrated error signal with the differentiated output signal of the ADC. The output signal of the system is independent of the jitter associated with the ADC.

In another aspect, an exemplary embodiment of the present disclosure may provide a system for suppressing aperture noise associated with an analog-to-digital converter (ADC) comprises a clock generator configured to generate a clock signal, an output signal of the system, an input signal of the ADC, and an output signal of the ADC. The system may comprise a delay element, a time subtractor, a time-to-digital converter (TDC), a filter element, a first digital subtractor, an integrator, a differentiator, and a multiplier. The delay element may be configured to delay the clock signal to obtain a delayed clock signal. The time subtractor may be configured to subtract the clock signal from the delayed clock signal to obtain a subtracted output signal. The time subtractor has a first negative input terminal and a first positive input terminal in which the first negative input terminal receives the delayed clock signal and the first positive input terminal receives the clock signal. The TDC may be configured to quantize the subtracted output signal to obtain a quantized output signal. The filter element may be configured to average the quantized signal to obtain an averaged quantized signal. The first digital subtractor is configured to subtract the averaged quantized signal from the quantized signal to obtain an error signal. The first digital subtractor has a second negative input terminal and a second positive input terminal in which the second negative input terminal receives the averaged quantized signal from the filter element and the second positive terminal receives the quantized output signal from the time-to-digital converter. The integrator may be configured to integrate the error signal to obtain an integrated error signal. The differentiator may be configured to differentiate the output signal of the ADC to obtain a differentiated output signal of the ADC. The multiplier may be configured to multiply the integrated error signal with the differentiated output signal of the ADC. The output signal of the system is independent of the jitter associated with the ADC.

In another aspect, an exemplary embodiment of the present disclosure may provide a method for measuring and suppressing an estimated aperture noise by using self-referred time measurements in a system that comprises generating, by a clock signal generator, a clock signal with the estimated aperture noise; generating, by an analog-to-digital converter, an output signal of the ADC with associated jitter; outputting, by the first mechanism, an output signal of the system; wherein the estimated aperture noise is subtracted from the output signal of the ADC such that the estimated aperture noise is independent of the output signal of the system.

In yet another aspect, an exemplary embodiment of the present disclosure may provide a method for measuring and suppressing an estimated aperture noise by using self-referred time measurements in a system that comprises generating, by a clock signal generator, a clock signal with the estimated aperture noise; delaying, by a delay element, the clock signal to obtain a delayed clock signal; subtracting, by a time subtractor, the clock signal from the delayed clock signal to obtain a subtracted output signal; quantizing, by a time-to-digital converter (TDC), the subtracted output signal to obtain a quantized output signal; subtracting, by a first digital subtractor, the averaged quantized signal from the quantized signal to obtain an error signal; integrating, by an integrator, the error signal to obtain an integrated error signal; differentiating, by a differentiator, the output signal of the ADC to obtain a differentiated output signal of the ADC; and multiplying, by a multiplier, the integrated error signal with the differentiated output signal of the ADC; wherein the estimated aperture noise is subtracted from the output signal of the ADC such that the estimated aperture noise is independent of the output signal of the system.

In yet another aspect, an exemplary embodiment of the present disclosure may provide a system that suppresses the effect of the jitter on the system.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
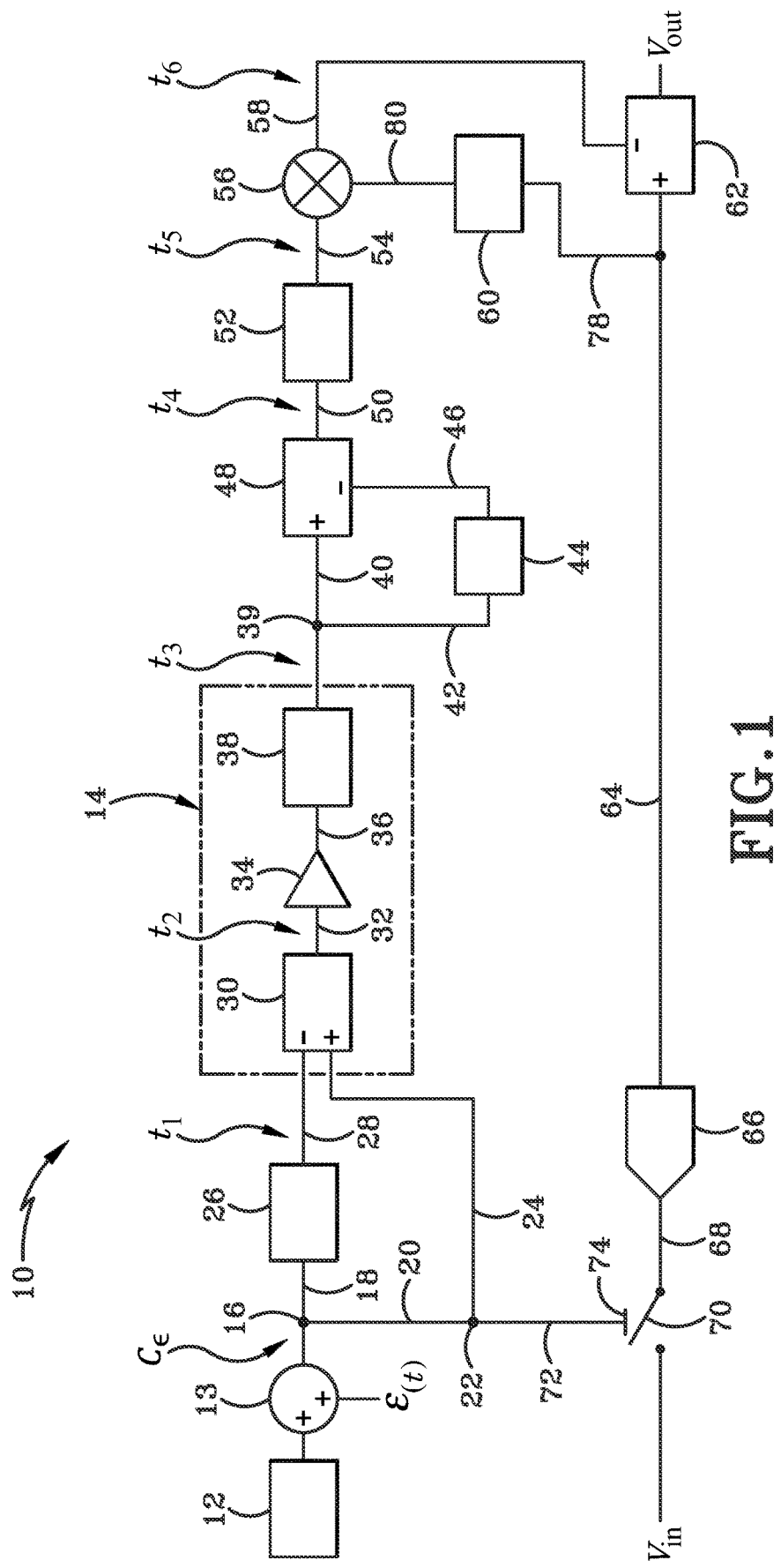
FIG. 1 illustrates the system and the analog-to-digital converter.
Figure 2:
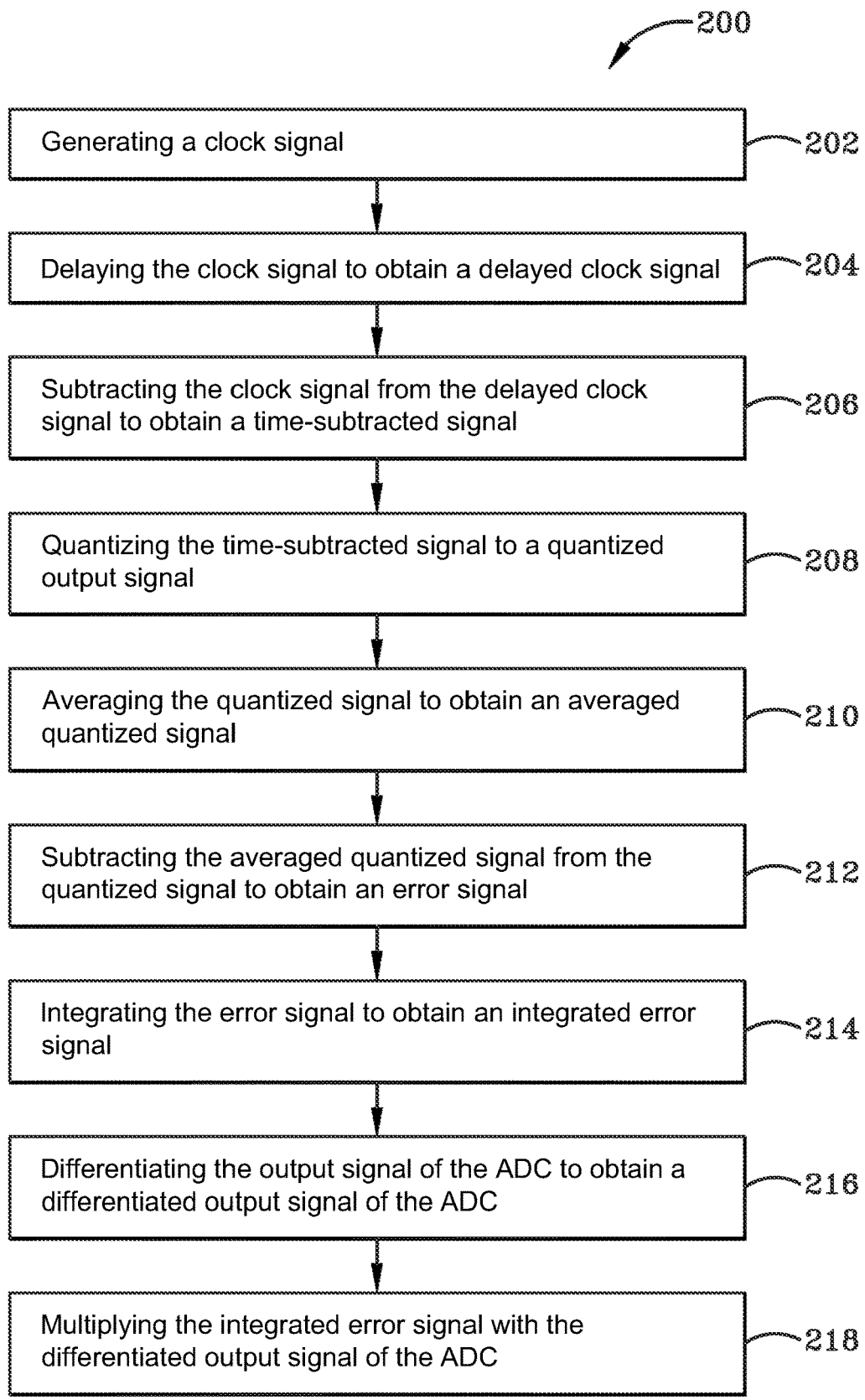
FIG. 2 illustrates an exemplary method flow chart for measuring and suppressing aperture noise within a system.

A system 10 and method of operation thereof is depicted in the present disclosure and in FIGS. 1 and 2. System 10 is an apparatus electrically coupled to an analog-to-digital converter (ADC) 66, in one particular embodiment a Nyquist ADC, that has an input voltage and an output voltage. System 10 is configured to isolate and suppress jitter associated with an analog-to-digital converter, such as analog-to-digital converter 66.

As illustrated in FIGS. 1 and 3, system 10 includes a clock 12, a delay element 26, a first mechanism 14 that includes a time subtractor 30 with a first positive input terminal and a first negative input terminal, a time amplifier 34, and a time-to-digital converter (TDC) 38, a filter element 44, a first digital subtractor 48 that includes a second positive input terminal and a second negative input terminal, an integrator 52, a multiplier 56 that includes a first multiplier input and a second multiplier input, a differentiator 60, a second digital subtractor 62 that includes a third positive input terminal and a third negative input terminal, a switch 70, and a contact 74.

In the illustrated embodiment, the clock 12 is electrically connected to a first node 16 in system 10. The clock 12 is also electrically connected to the delay element 26. Specifically, a first wire 18 in system 10 electrically connects the output of the clock 12 to the input of the delay element 26 such that the clock 12 is in series with the delay element 26. Such electrical connection between the clock 12 and the delay element 26 allows the delay element 26 to receive a clock signal from the clock 12, which is described in more detail below. In addition, system 10 includes a second wire 20 that connects the first node 16 to a second node 22 in system 10. A third wire 24 in the system 10 electrically connects the second node 22 to the input of the first mechanism 14. Specifically, the third wire 24 in the system 10 electrically connects the second node 22 to the first positive input terminal of the time subtractor 30. With this, the clock 12 is electrically connected to the first mechanism 14 via the second and third wires 20, 24 where the output of the clock 12 is electrically connected to the input of the first mechanism 14 at the first positive input terminal of the time subtractor 30. Such electrical connection between the clock 12 and the first mechanism 14 allows the time subtractor 30 to receive a clock signal from the clock 12 that bypasses the delay element 26, which is described in more detail below. Furthermore, the clock 12 defines a first positive terminal and a second positive terminal.

Each wire, as described and illustrated herein, are construed such that each wire is formed of one electrical conductor or a number of electrical conductors. For example, each wire described and illustrated herein can be segments of the same wire (e.g., the second wire 20 and the third wire 24 may be a single wire), or that each wire is a separate, different wire in the system 10.

The delay element 26 in system 10 is electrically connected to the first mechanism 14. Specifically, a fourth wire 28 in the system 10 electrically connects the output of the delay element 26 to the first negative input terminal of the time subtractor 30 in the first mechanism 14 such that the delay element 26 is in series with the time subtractor 30. Such electrical connection between the delay element 26 and the first mechanism 14 allows the first mechanism 14 to receive the delayed clock signal from the delay element 26, which is described in detail below. Furthermore, the delay element 26 includes a known time propagation delay τ that delays voltage of a given signal along the delay element 26 from the input of the delay element 26 to the output of the delay element 26. In system 10, the propagation delay τ of the delay element 26 must be close to one clock period, which is physically large for low frequency clocks.

As to the first mechanism 14, the time subtractor 30 is electrically connected to the clock 12 and the delay element 26 in system 10 (as described above). The time subtractor 30 is electrically connected to the time amplifier 34 in the first mechanism 14. Specifically, a fifth wire 32 in the first mechanism 14 electrically connects the output of the time subtractor 30 to the input of the time amplifier 34 such that the time subtractor 30 is in series with the time amplifier 34. In addition, the time amplifier 34 is electrically connected to the time-to-digital converter 38 in the first mechanism 14. Specifically, a sixth wire 36 in the first mechanism 14 electrically connects the output of the time amplifier 34 to the input of the time-to-digital converter 38 such that the time amplifier 34 is in series with the time-to-digital converter 38. Furthermore, the time-to-digital converter 38 is electrically connected to a third node 39 in system 10. The third node 39 allows the time-to-digital converter 38 to be electrically connected to the filter element 44 and the first digital subtractor 48, which is described in more detail below.

From the third node 39 in system 10, a seventh wire 40 electrically connects the third node 39 to the first digital subtractor 48. More specifically, the seventh wire 40 electrically connects the third node 39 to the second positive input terminal of the first digital subtractor 48. Such connection electrically connects the time-to-digital converter 38 to the first digital subtractor 48. In addition, an eighth wire 42 in system 10 electrically connects the third node 39 to the filter element 44. More specifically, the eighth wire 42 electrically connects the third node 39 to the input of the filter element 44. Moreover, a ninth wire 46 in system 10 electrically connects the filter element 44 to the first digital subtractor 48. More specifically, the ninth wire 46 in system 10 electrically connects the output of the filter element 44 to the second negative input terminal of the first digital subtractor 48. Such connection electrically connects the filter element 44 to the first digital subtractor 48 in system 10.

From the first digital subtractor 48 in system 10, a tenth wire 50 electrically connects the first digital subtractor 48 to the integrator 52. More specifically, the tenth wire 50 electrically connects the output of the first digital subtractor 48 to the input of the integrator 52 such that the first digital subtractor 48 is in series with the integrator 52 in system 10. An eleventh wire 54 electrically connects the integrator 52 to the multiplier 56. More specifically, the eleventh wire 54 electrically connects the output of the integrator 52 to the first multiplier input of the multiplier 56 such that the integrator 52 is in series with the multiplier 56.

From the multiplier 56, a twelfth wire 58 electrically connects the multiplier 56 to the second digital subtractor 62. More specifically, the twelfth wire 58 electrically connects the multiplier 56 to the second digital subtractor 62 from the output of the multiplier 56 to the third negative input terminal of the second digital subtractor 62 such that the multiplier 56 is in series with the second digital subtractor 62 in system 10. In addition, a thirteenth wire 64 electrically connects the second digital subtractor 62 to the analog-to-digital converter 66. More specifically, the thirteenth wire 64 electrically connects the second digital subtractor 62 to the analog-to-digital converter 66 from the third positive input terminal of the second digital subtractor 62 to the output of the analog-to-digital converter 66 such that the second digital subtractor 62 is in series with the analog-to-digital converter 66.

From the input of the analog-to-digital converter 66, a fourteenth wire 68 electrically connects the analog-to-digital converter 66 to the switch 70. In addition, a fifteenth wire 72 electrically connects the second node 22 to the contact 74 in system 10. In the illustrated embodiment, the switch 70 can be in a closed position and an open position. The switch 70 is in the closed position when the voltage impingent on the contact 74 is above certain voltage threshold. The switch 70 is in the open position when the voltage impingent on the contact 74 is below a certain voltage threshold. In addition, the clock 12 and the analog-to-digital converter 66 are electrically connected via the second, fourteenth, and fifteenth wires 20, 68, 70 at the output of the clock 12 and the input of the analog-to-digital converter 66.

From the output of the analog-to-digital converter 66, the thirteenth wire 64 electrically connects the analog-to-digital converter 66 to a fourth node 76. From the fourth node 76, a sixteenth wire 78 electrically connects the analog-to-converter 66 to the differentiator 60 in system 10. More specifically, the sixteenth wire 78 electrically connects the input of the differentiator 60 to the output of the analog-to-digital converter 66 in system 10. In addition, a seventeenth wire 80 electrically connects the differentiator 60 to the multiplier 56. More specifically, the seventeenth wire 80 electrically connects the output of the differentiator 60 to the second multiplier input of the multiplier 56 such that the differentiator 60 is in series with the multiplier 56.

In one embodiment of system 10, the aperture noise suppression circuitry and the analog-to-digital converter 66 are in parallel with each other. Specifically, each of the delay element 26, time subtractor 30, time amplifier 34, TDC 38, filter 44, first digital subtractor 48, integrator 52, and multiplier 56 is in parallel with the ADC 66. This particular configuration in system 10 allows the clock 12 to send a clock signal through each of the delay element 26, the first mechanism 14, the filter element 44, the first digital subtractor 48, the integrator 52, and the multiplier 56 and through the analog-to-digital converter 66. With this architecture, the jitter that is associated with the output of the analog-to-digital converter 66 can be computed and isolated such that the jitter associated with the output of the analog-to-digital converter 66 is suppressed and the analog-to-digital converter 66 is independent of the jitter, which is described in more detail below.

Having now described the structure of system 10 and the various components and connections thereof within system 10, a method of use thereof will now be described.

In the illustrated embodiment, the clock 12 generates a clock signal that is sent from the output of the clock 12 and into the system 10 at the first node 16. Prior to the system 10 receiving the clock signal, the clock signal generated by the clock 12 includes an aperture noise ($\epsilon_t$). As illustrated in FIG. 1, the aperture noise ($\epsilon_t$) is included into the clock signal by a summation element 13, which is a non-physical abstraction showing the addition of the unintended, aperture noise ($\epsilon_t$) into the clock signal the system 10. With, the clock signal generated by the clock 12, including the aperture noise ($\epsilon_t$), passes through both the first node 16 and the first wire 18 and into the delay element 26, specifically into the input of the delay element 26. The clock signal generated by the clock 12 also passes through both the first node 16, the second wire 20, the second node 22, and the third wire 24 and into the first mechanism 14, specifically into the first positive input terminal of the time subtractor 30. The clock signal generated by clock 12 also passes through the first node 16, the second wire 20, the second node 22, the fifteenth wire 72, contact 74, switch 70, the fourteenth wire 68 and into the analog-to-digital converter 66, specifically into the input of the analog-to-digital converter 66.

Additionally, the ADC 66 in system 10 receives the input signal $V_{in}$, which is sampled by switch 70 at rate defined by clock 12. The ADC 66 takes this sampled input voltage and quantizes it to yield an output signal of the ADC. The output signal of the ADC is discretized such that the output signal of the ADC is outputted in a binary number. Once outputted, each of the differentiator 60 and the second digital subtractor 62 in system 10 receives the output signal of the ADC, specifically at the input of the differentiator 60 and the third positive input terminal of the second digital subtractor 62. Once the output signal of the ADC is received by the differentiator 60, the differentiator 60 performs a computation, specifically a derivation, upon the output signal of the ADC, which is described in more detail below. Once the computation is complete, the differentiator 60 outputs a differentiated output signal of the output signal of the ADC to the multiplier 56 at the second multiplier input. The use of the differentiated output signal from the differentiator 60 by the multiplier 56 is described in more detail below.

As the clock signal enters the delay element 26, the delay element 26 delays the clock signal as the clock signal passes from the input of the delay element 26 to the output of the delay element 26. The delay element 26 in the system 10 contains a known time propagation delay $\tau$ that delays the voltage of the clock signal such that the clock signal takes a certain amount of time to progress through the delay element 26 based upon the time propagation delay $\tau$. The value of the time propagation delay $\tau$ in the delay element 26 is a known value determined by the law of physics. Such a value may be selected by a skilled artisan based upon a particular application of system 10. As the clock signal reaches the output of the delay element 26, the delay element 26 outputs a delayed clock signal relative to the propagation delay $\tau$ at a first time measurement $t_1$ differing from the initial time measurement of the clock signal entering the system 10.

The clock signal generated by the clock 12 advances into the first mechanism 14. Specifically, the clock signal advances into the time subtractor 30 of the first mechanism 14 at the first positive input terminal of said time subtractor 30. The clock signal that advances into the first positive input terminal of the time subtractor 30 bypasses the delay element 26 such that the clock signal advancing into the first positive input terminal of the time subtractor 30 comprises the initial time measurement of the clock signal when said output clock entered the system 10.

The time subtractor 30 in system 10 receives the delayed clock signal at the first negative input terminal of the time subtractor 30 from the delay element and receives the clock signal received at the first positive input terminal of the time subtractor 30 from the clock 12. The time subtractor 30 measures the time difference between each signal by subtracting the clock signal received at the first negative input terminal of the time subtractor 30 from the clock signal received at the first positive input terminal of the time subtractor 30 based on the known propagation delay $\tau$ of the delay element 26. The computation of the time-subtracted output signal is described in more detail below. Once this computation is complete, the time subtractor 30 outputs the time-subtracted output signal to the time amplifier 34, via the fifth wire 32, at a second time measurement $t_2$ relative to the initial time the clock signal entered the system 10. The time amplifier 34 amplifies the subtracted output signal then advances the time-subtracted output signal to the time-to-digital converter 38 via the sixth wire 36.

Once the time-to-digital converter 38 receives the time-subtracted output signal from the time subtractor 30, the time-to-digital converter 38 quantizes the time differences measured by the time subtractor 30 in the first mechanism 14, which are described above. As such, the time-to-digital converter 38 quantizes the time measurements from the time-subtracted output signal to a quantized representation of the measured time differences (i.e. binary numbers) by outputting a quantized output signal. In addition, the quantized output signal includes the quantization noise of the time-to-digital converter 38, which is described in more detail below. This quantization noise is assumed to be spectrally white and uncorrelated to the aperture noise generated by clock 12. Once the quantization is complete, the time-to-digital converter 38 outputs the quantized output signal at a third time measurement $t_3$ relative to the initial time the clock signal entered system 10 and advances to the third node 39.

As the quantized output signal advances through the third node 39, each of the filter element 44 and the first digital subtractor 48 receives the quantized output signal. As to the filter element 44, the filter element 44 performs a computation that averages the quantized output signal over a specified time window to obtain an averaged quantized signal, which is described in more detail below. Upon the completion of this averaging, the filter element 44 outputs an averaged quantized signal based upon the average of the quantized output signal over the time window. As to the first digital subtractor 48, the first digital subtractor 48 receives the quantized output signal via the seventh wire 40 at the second positive input terminal of the first digital subtractor 48. In addition, the averaged quantized signal outputted by the filter element 44 is received by the first digital subtractor 48 via the ninth wire 46 at the second negative input terminal of the first digital subtractor 48.

Once the first digital subtractor 48 receives each of the quantized output signal from the time-to-digital converter 38 and the averaged quantized signal from the filter element 44, the first digital subtractor 48 performs a computation that subtracts out the time propagation delay $\tau$ from each of the quantized output signal and the averaged quantized signal to output an error signal. The computation performed by the first digital subtractor 48 to output the error signal is described in more detail below. Once the computation is complete, the first digital subtractor 48 outputs the error signal to the integrator 52 via the tenth wire 50 at a fourth time measurement $t_4$ relative to the initial time the clock signal entered system 10.

As the integrator 52 receives the error signal from the first digital subtractor 48, the integrator 52 performs a computation where the integrator 52 integrates the error signal to obtain an integrated error signal. The computation performed by the integrator 52 is described in more detail below. Once the computation is complete, the integrator 52 outputs the integrated error signal to the multiplier 56 via the eleventh wire 54 that includes a fifth time measurement $t_5$ relative to the initial time the clock signal entered system 10.

The multiplier 56 receives the integrated error signal from the integrator 52 and the differentiated output signal of the ADC from the differentiator 60. Specifically, the multiplier 56 receives the integrated error signal at the first multiplier input of the multiplier 56 and receives the differentiated output signal of the ADC at the second multiplier input of the multiplier 56. The multiplier 56 performs the computation of multiplying the integrated error signal and the discrete derivative of the ADC output together. Such computation performed by the multiplier 56 is described in more detail below. Once the computation is complete, the multiplier 56 outputs the multiplier output signal to the second digital subtractor 62 via the twelfth wire 58 that includes the sixth time measurement $t_6$ relative to the initial time the clock signal entered system 10.

The second digital subtractor 62 receives the multiplier output signal from the multiplier 56 and receives the output signal of the ADC from the analog-to-digital converter 66. Specifically, the second digital subtractor 62 receives the multiplier output signal at the third negative input terminal of the second digital subtractor 62 and receives the output signal of the ADC at the third positive input terminal of the second digital subtractor 62. The second digital subtractor 62 computes the output signal of the system ($V_{out}$). The output signal of the system is computed by subtracting the output signal of the ADC from the multiplier output signal at the sixth time measurement $t_6$. Once the computation is completed, the output signal of the system is independent of the jitter associated with the analog-to-digital converter 66. The computation performed by the second digital subtractor 62 is described in more detail below.

FIG. 2 illustrates an exemplary flow chart 200 that provides a method for suppressing aperture noise associated with an analog-to-digital converter. Step 202 includes generating, by a clock signal generator, a clock signal. Step 204 includes delaying, by a delay element, the clock signal to obtain a delayed clock signal. Step 206 includes subtracting, by a time subtractor, the clock signal from the delayed clock signal to obtain a subtracted output signal. Step 208 includes quantizing, by a time-to-digital converter, the time-subtracted output signal to obtain a quantized output signal. Step 210 includes averaging, by a filter element, the quantized signal to obtain an averaged quantized signal. Step 212 subtracting, by a first digital subtractor, the averaged quantized output signal from the quantized signal to obtain an error signal. Step 214 includes integrating, by an integrator, the error signal to obtain an integrated error signal. Step 216 differentiating, by a differentiator, the output signal of the ADC to obtain a differentiated output signal of the ADC. Step 218 includes multiplying the integrated error signal with the differentiated output signal of the ADC, wherein an output signal of the system is independent of the jitter associated with the ADC.

Computations of Suppressing a Jitter Associated with an Output of an Analog-to-Digital Converter The exemplary mathematics of suppressing a jitter associated with an output of an analog-to-digital converter with system 10 are described as follows: Assuming that the analog-to-digital converter is superior to the noise jitter emitted within the system (i.e., the quantization noise is negligible), the following equation is presumed:

$$Vx = Vin(t+\sigma(t)) \quad \text{Equation (1)},$$

where $\sigma(t)$ is defined as the instantaneous jitter impingent on the sampler of the analog-to-digital converter.

$$Vx = Vin(t+\sigma[t]) \quad \text{Equation (2)},$$

where Equation (2) is modified to reflect the discrete nature of the sampled error. The jitter induced error, $\epsilon[t]$, referenced in Equation (2) is defined as:

$$\epsilon[t] = \frac{d}{dt}(Vin(t)) * \sigma(t), \quad \text{Equation (3)}$$

where $\sigma(t)$ is defined as the instantaneous jitter value at time t in Equation (3). The clock 12, which is impingent on the delay element with the associated jitter, $C_\epsilon$, is defined in Equation (4) as:

$$C_\epsilon = clk(t)+\sigma(t) \quad \text{Equation (4)}.$$

As illustrated in FIG. 1, the location of the clock signal $C_\epsilon$ in system 10 begins when the clock signal $C_\epsilon$ is sent to the delay element 26. As shown in Equation (4), the clock signal $C_\epsilon$ is generated by the clock 12, which sends a clock signal clk(t) containing an instantaneous jitter value $\sigma(t)$ from the clock 12 to the delay element 26. Prior to the clock signal $C_\epsilon$ entering the delay element 26, each of the clock signal clk(t) and the instantaneous jitter value $\sigma(t)$ is equal in time to each other. Furthermore, the clock signal $C_\epsilon$ advances to the analog-to-digital converter 66, specifically to the input of the analog-to-digital converter 66. Upon receiving the clock signal $C_\epsilon$, the analog-to-digital converter 66 outputs an output signal of the ADC to the input of the differentiator 60 and to the third positive input terminal of the second digital subtractor 62, which includes Equation (1) as shown above. Upon receiving the output signal of the ADC from the analog-to-digital converter 66, the differentiator 60 in configured to perform a derivation upon the output signal of the ADC, which is shown in Equations (2) and (3). Upon completion of the computation in Equations (2) and (3), the differentiator 60 outputs the differentiated output signal of the ADC, as shown in Equation (3), to the second multiplier input of the multiplier 56.

Since the next sections of the system are defined in time measurements rather than voltage measurements as shown in Equations (1) through (4), the following equations place the signals in terms of time measurement. In addition, the following time measurements are referred to the clock clk(t) as a reference as defined by Equations (5) and (6):

$$clk(t)=t \quad \text{Equation (5)}$$

and $$C_\epsilon = (t)+\sigma(t) \quad \text{Equation (6)}.$$

As shown in Equation (6), the transformation from voltage measurements to time measurements does not affect the instantaneous jitter value $\sigma(t)$ since the instantaneous jitter value $\sigma(t)$ is already relative to the clock timing.

As illustrated in FIG. 1, the clock signal $C_\epsilon$ enters into the input of the delay element 26 and progresses to the output of the delay element 26. As the clock signal $C_\epsilon$ progresses through the delay element 26, Equations (7) and (8) apply where:

$$t_1 = C_\epsilon(t-\tau) \quad \text{Equation (7)},$$

which simplifies to $$t_1 = t+\tau+\sigma(t-\tau) \quad \text{Equation (8)},$$

where $\tau$ is the propagation delay of delay element 26. As the clock signal $C_\epsilon$ reaches the output of the delay element 26, the delay element 26 is configured to apply the propagation delay $\tau$ onto clock signal $C_\epsilon$. As the clock signal $C_\epsilon$ exits from the delay element 26 at the output of the delay element 26, the delay element 26 outputs a delayed clock signal that comprises the value of the first time measurement $t_1$. With this, the delayed clock signal that comprises the value of the first time measurement $t_1$ is greater than the clock signal $C_\epsilon$ that comprises the value of the initial time measurement when the clock signal $C_\epsilon$ entered into the delay element 26.

From the output of the delay element 26 illustrated in FIG. 1, the delayed clock signal advances into the time subtractor 30 and progresses toward the output of the time subtractor 30. As the delayed clock signal progresses through the first mechanism 14, Equations (9) and (10) are applied:

$$t_2 = C_\epsilon - t_1 = t+\sigma(t)-(t+\tau+\sigma(t-\tau)) \quad \text{Equation (9)},$$

which simplifies to $$t_2 = \sigma(t)-\sigma(t-\tau) \quad \text{Equation (10)}.$$

Here, the time subtractor 30 applies a time-subtractor onto the delayed clock signal based upon the architecture of the time subtractor 30 in the first mechanism 14. Specifically, as illustrated in FIG. 1, the time subtractor 30 includes the first positive input terminal that allows the clock signal $C_\epsilon$ to enter through the first positive input terminal, bypassing the delay element 26, and into the time subtractor 30. With the clock signal $C_\epsilon$ and the delayed clock signal, the time subtractor integrated into the time subtractor 30 is configured to subtract the delayed clock signal at the first time measurement $t_1$ from the clock signal $C_\epsilon$ as shown in Equation (9). Upon simplifying and reducing Equation (9), Equation (10) provides the second time measurement $t_2$ upon the instantaneous jitter value $\sigma(t)$ of the clock signal $C_\epsilon$ and the instantaneous jitter value $\sigma(t-\tau)$ of the delayed clock signal. As such, the time subtractor 30 outputs a time-subtracted output signal that isolates the jitter values at the delayed time (i.e., $\sigma(t-\tau)$) and at the non-delayed time (i.e., $\sigma(t)$).

From the output of the time subtractor 30 and second time measurement $t_2$ illustrated in FIG. 1, the time-subtracted output signal outputted from the time subtractor 30 advances into the time-to-digital converter 38 at the input of the time-to-digital converter 38 and progresses toward the output of the time-to-digital converter 38. As the time-subtracted output signal arrives at the third time measurement $t_3$, Equation (10) is applied:

$$t_3 = t_2 + Q[nt] \quad \text{Equation (10),}$$

where $Q[nt]$ is the quantization noise of the time-to-digital converter 38 at an integer multiple of the clock period $nt$. With Equation (10), the time-to-digital converter 38 is configured to quantize the time-subtracted output signal to a quantized output signal (i.e., converts the signal from a time measurement into a digital measurement). As such, the quantized signal at the third time measurement $t_3$ includes the quantization noise of the time-to-digital converter 38 at an integer multiple of clock period $nt$.

From the output of time-to-digital converter 38 and the third time measurement $t_3$ illustrated in FIG. 1, the quantized output signal outputted from the time-to-digital converter 38 advances into the filter element 44 at the input of the filter element 44 and progresses toward the output of the filter element 44. As the quantized output signal advances into the filter element 44, Equation (11) is applied:

$$\text{Average}(t_3) = \tau \quad \text{Equation (11).}$$

The filter element 44 is configured to average the quantized output signal from the time-to-digital converter 44 at the third time measurement $t_3$. Once the filter element 44 averages the quantized output signal, the average of the quantized output signal at the third time measurement $t_3$ results in the value $\tau$, which is the propagation delay of the delay element 26 defined in Equations (7) and (8). Equation (11) yields the value $\tau$ because both the jitter $\sigma(t)$ and quantization noise $Q[nt]$ are assumed to be additive white Gaussian noise (AWGN) signals, meaning that the average of both the jitter $\sigma(t)$ and quantization noise $Q[nt]$ computes to zero. As such, the filter element 44 outputs an averaged quantized signal with the averaged value being the propagation delay $\tau$.

From the output of the filter element 44, the averaged quantized signal from the filter element 44 advances into the first digital subtractor 48 at the second negative input terminal and progresses toward the output of the first digital subtractor 48. In addition, from the output of the time-to-digital converter 38, the quantized output signal from the time-to-digital converter 38 advances into the first digital subtractor 48 at the second positive input terminal of the first digital subtractor 48 and progresses toward the output of the first digital subtractor 48. As each of the averaged quantized signal and quantized output signal advances through the first digital subtractor 48, Equations (12) and (13) are applied:

$$t_4 = \sigma(t) - \sigma(t-\tau) + Q[nt] \quad \text{Equation (12),}$$

in which $\sigma(t) - \sigma(t-\tau)$ is by definition the discrete time derivative $$t_4 = \frac{d}{dn}\sigma[nt] + Q[nt]. \quad \text{Equation (13)}$$

The first digital subtractor 48 is configured to apply Equations (12) and (13) to the quantized output signal outputted from the time-to-digital converter 38 and the averaged quantized signal outputted from the filter element 44. By applying Equations (12) and (13), the first digital subtractor 48 is configured to subtract out the propagation delay $\tau$ in system 10 at the fourth time measurement $t_4$ since the propagation delay $\tau$ is a known value set by the laws of physics. As a result, the first digital subtractor 48 computes and outputs an error signal from the output of the first digital subtractor 48 that provides the difference in pulsewidths between the jitter $\sigma[nt]$ and the quantization noise $Q[nt]$.

From the output of the first digital subtractor 48 and at the fourth time measurement $t_4$, the error signal advances into the integrator 52 at the input of the integrator 52 and progresses toward the output of the integrator 52. As the error signal advances through the integrator 52, Equations (14) applies:

$$t_5 = \int_0^t \frac{d}{dn}\sigma[nt] + Q[nt]dn. \quad \text{Equation (14)}$$

Since the values at the fifth time measurement $t_5$ are discretized, the integral can be replaced with a sum and the terms can be separated in Equation (15) such that:

$$t_5 = \sum_0^n \frac{d}{dn}\sigma[nt] + \sum_0^n Q[nt]dn. \quad \text{Equation (15)}$$

For convenience of notation, $\int_0^t Q[nt]dn$ will be referred to as $Qw$. The term $Qw$ is the value of a random walk process, which is a well-known type of noise understood in the field of this invention. By the fundamental theorem of calculus, Equation (15) can be simplified and reduced to Equation (16):

$$t_5 = \sigma[nt] + Qw \quad \text{Equation (16).}$$

Upon the completed calculations in Equations (14) through (16) by the integrator 52, the integrator 52 is configured to compute and output an integrated error signal at the fifth time measurement $t_5$. The integrated error signal contains a running chain of the pulsewidths from time zero to integer n, which provides the necessary information to calculate the jitter at each point along a signal progressing through the system 10.

From the output of the integrator 52 and at the fifth time measurement $t_5$, the integrated error signal outputted from the integrator 52 advances into the multiplier 56 at the first multiplier input of the multiplier 56. In addition, the differentiated output signal of the ADC outputted from the differentiator 60 advances into the multiplier 56 at the second multiplier input of the multiplier 56. As each of the integrated error signal and differentiated output signal of the ADC advances through the multiplier 56, Equation (17) is applied:

$$t_6 = t_5 * \frac{d}{dt}(Vx) = t_5 * \frac{d}{dt}(Vin) = \frac{d}{dt}(Vin) * (\sigma[nt] + Qw). \quad \text{Equation (17)}$$

The multiplier 56 is configured to apply Equation (17) and multiple the integrated error signal at the fifth time measurement $t_5$ with the differentiated output signal of the ADC. This multiplication procedure approximately yields the following result:

$$\frac{d}{dt}(Vin) * (\sigma[nt] + Qw),$$

which is approximate due to the crossing between the continuous and discrete time conventions in these computations. Upon completing the computation, the multiplier 56 outputs the multiplier output signal to the second digital subtractor 62 at the third negative input terminal of the second digital subtractor 62.

From the output of the multiplier 60 and at the sixth time measurement $t_6$, the multiplier output signal outputted from the multiplier 60 advances into the second digital subtractor 62 at the third negative input terminal of the second digital subtractor 62. In addition, the output signal of the ADC outputted from the analog-to-digital converter 66 advances into the second digital subtractor 62 at the third positive input terminal of the second digital subtractor 62. As each of the multiplier output signal and output signal of the ADC advances through the second digital subtractor 62, Equation (18) is applied:

$$Vout = x - t_6 = Vin[nt] - \frac{d}{dt}(Vin) * Qw. \quad \text{Equation (18)}$$

The second digital subtractor 62 is configured to subtract the multiplier output signal from the output of the ADC. As such, the second digital subtractor 62 outputs the output signal of the system (Vout) in Equation (18), which is independent of the instantaneous jitter value $\sigma[nt]$. As calculated in Equation (18), Vout is dependent upon the value of Qw. In this equation, Qw is a function of the accuracy of the time-to-digital converter 38 and the averaging and/or filtering of the quantized output signal of the time-to-digital converter 38. With this, the output signal of analog-to-digital converter 66 can be improved to the extent that the time-to-digital converter 38 is accurate enough that the function $$\frac{d}{dt}(Vin) * Qw$$

is smaller than the error that would be introduced by the jitter into system 10. Furthermore, by changing the averaging and/or filtering of the quantized signal output of the time-to-digital converter 38, the spectral characteristics of Qw can be engineering such that the noise can be pushed higher or lower in the spectrum allowing for spectral shaping.

In addition to description and the method of use of system 10, the architecture of system 10 is considered advantageous at least because the architecture of system 10 suppresses the aperture noise resulting from clock jitter with the use of self-referred time measurements. As illustrated in FIG. 1 and in the calculations, the use of self-referred time measurements provides a mechanism in the system 10 to trace and suppress the aperture noise within the system 10. Additionally, the architecture of system 10 is considered advantageous at least because system 10 does not measure the jitter and/or aperture noise directly. Rather, system 10 measures a known constant in the clock signal, specifically the propagation delay $\tau$ of the delay element 26, that is applied to the clock signal in system 10. With this, the known constant can be removed from the signal, based upon the computations described in detail above, so that system 10 can isolate and suppress jitter and/or aperture noise at each point measured by the analog-to-digital converter 66. The architecture of system 10 is also considered advantageous at least because system 10 may be implemented into an analog-to-digital converter that comprises of new highly linear time multipliers that allows for measurements of arbitrarily small time difference between the clock signal and the jitter and/or aperture noise (e.g., U.S. patent application Ser. No. 16/415, 162). Such time differences that can be measured by the architecture of system 10 with new highly linear time multipliers can be measured at substantially less than 1 picosecond.

System 10 described and illustrated herein is considered advantageous at least because the implementation of this specific system architecture has the capability to raise the maximum achievable effective number of bits (ENOB) by greater than one bit. The advantage of this specific system architecture corresponds to the possibility of being able to reduce the decimation rate, or the area and/or power greater of the system greater than four times. Additionally, the advantage of this specific system corresponds to the possibility of the area and/or power of the ADC. For example, to scale an ADC from X bits to X+1 bits accuracy, such scaling generally requires the area and power of the ADC to go up by a factor of 4. By increasing the resolution via the presented method, rather than scaling, the area/power of the ADC is "reduced" in so far as the scaling is no longer required. Moreover, the system 10 described and illustrated herein is considered advantageous at least because system 10 does not require any hooks into an analog-to-digital converter, such as analog-to-digital converter 66. The input and output in this system is the input of clock 12 and the output of the analog-to-digital converter 66. The system 10 can also be hot-placed onto an existing, self-contained analog-to-digital converter to isolate and suppress the jitter and/or aperture noise associated with an output of an analog-to-digital converter.

System 10 that has been described and illustrated herein is considered advantageous at least because system 10 can be implemented into either a digital circuitry array or a field programmable gate array based upon a particular application of system 10. The choice of implementing system 10 into either array can be made by a skilled artisan based upon a particular application of system 10. In addition, the delay element 26 that has been described and illustrated herein can be made of an active metal material or a passive metal material. The choice of selecting either metal material for the delay element 26 can be made by a skilled artisan based upon a particular application of the delay element 26.

Furthermore, the gain of the time-to-digital converter 38 in system 10 includes an auxiliary self-calibration loop, which is not illustrated in these embodiments. The auxiliary self-calibration loops ensures that the value of the delay ($\tau$) is approximately one clock cycle, especially if the frequency of the clock 12 is variable. Additionally, the quantization error and/or noise of the time-to-digital converter 38 accumulates over time. As such, the time-to-digital converter 38 in system 10 may need to be reset periodically during use of system 10. The periodic resetting of the time-to-digital converter 38 will cause spurs in which said spurs can be carefully placed and/or rejected downstream in system 10.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, system configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated system (ASIC), a programmed logic device, a memory device containing instructions, an electric device having a memory, or the like. Logic may include one or more gates, combinations of gates, or other system components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A system for measuring an estimated aperture noise by using self-referred time measurements, comprising:
    a clock generator configured to generate a clock signal that includes the estimated aperture noise;
    a first mechanism comprising a time substractor and a time-to-digital converter (TDC) electrically coupled to the clock generator and adapted to receive the clock signal;
    an analog-to-digital converter (ADC) electrically coupled to the clock generator;
    an output signal of the ADC; and
    an output signal of the system;
    wherein the estimated aperture noise is subtracted from the output signal of the ADC such that the estimated aperture noise is independent of the output signal of the system.

2. The system of claim 1, wherein the time subtractor is electrically coupled to the TDC such that the time subtractor is in series with the TDC.

3. The system of claim 2, wherein the first mechanism defines a time amplifier that is electrically coupled with and in series with the time subtractor and the TDC.

4. The system of claim 1, further comprising:
    a delay element that receives the clock signal and configured to delay the clock signal to obtain a delayed clock signal.

5. The system of claim 4, wherein the first mechanism receives the clock signal and delayed clock signal and is configured to quantize the time difference between delayed clock signal and the clock signal to obtain a quantized output signal.

6. The system of claim 5, further comprising:
    a filter element that receives the quantized output signal and is configured to average the quantized output signal to obtain an averaged quantized signal.

7. The system of claim 6, further comprising:
    a first digital subtractor that receives the averaged quantized signal and the quantized signal and is configured to subtract the averaged quantized signal from the quantized signal to obtain an error signal.

8. The system of claim 7, further comprising:
    an integrator that receives the error signal and is configured to integrate the error signal to obtain an integrated error signal.

9. The system of claim 8, further comprising:
a differentiator that receives the output signal of the ADC and is configured to differentiate the output signal of the ADC to obtain a differentiated output signal of the ADC.

10. The system of claim 9, further comprising:
a multiplier that receives the differentiated output signal of the ADC and the integrated error signal and is configured to multiply the integrated error signal with the differentiated output signal of the ADC to obtain the multiplier output signal.

11. The system of claim 10, further comprising:
a second digital subtractor that receives the multiplier output signal and the output signal of the ADC and is configured to subtractor the multiplier output signal from the output signal of the ADC to obtain the output signal of the system.

12. A method for measuring and suppressing an estimated aperture noise by using self-referred time measurements in a system, comprising:
generating, by a clock signal generator, a clock signal with the estimated aperture noise;
generating, by an analog-to-digital converter, an output signal of the ADC with associated jitter;
outputting, by a first mechanism comprising a time subtractor and a time-to-digital converter (TDC), an output signal of the system;
wherein the estimated aperture noise is subtracted from the output signal of the ADC such that the estimated aperture noise is independent of the output signal of the system.

13. The method of claim 12, further comprising:
delaying, by a delay element, the clock signal to obtain a delayed clock signal.

14. The method of claim 13, further comprising:
quantizing, by the first mechanism, the delayed clock signal to a quantized output signal.

15. The method of claim 14, further comprising:
averaging, by a filter element, the quantized signal to obtain an averaged quantized signal.

16. The method of claim 15, further comprising:
subtracting, by a first digital subtractor, the averaged quantized signal from the quantized signal to obtain an error signal.

17. The method of claim 16, further comprising:
integrating, by an integrator, the error signal to obtain an integrated error signal.

18. The method of claim 17, further comprising:
differentiating, by a differentiator, the output signal of the ADC to obtain a differentiated output signal of the ADC.

19. The method of claim 18, further comprising:
multiplying, by a multiplier, the integrated error signal with the differentiated output signal of the ADC.

* * * * *